SEMICONDUCTOR DEVICES

Filed April 3, 1969 2 Sheets-Sheet 1

Inventor
Mino Green
By [signature]
Attorney

SEMICONDUCTOR DEVICES

Filed April 3, 1969

2 Sheets-Sheet 2

| η | MGS (Å) | | |
|---|---|---|---|
| 1.0 | 150 | 300 | 500 |
| 0.9 | 173 | 340 | 580 |
| 0.8 | 183 | 365 | 620 |
| 0.7 | 200 | 392 | 680 |
| 0.65 | 208 | 409 | 695 |
| 0.6 | 213 | 430 | 737 |

Inventor
Mino Green
By John J. Pederson
Attorney 3,524,771
SEMICONDUCTOR DEVICES
Mino Green, Barnes, London, England, assignor to Zenith Radio Corporation, a corporation of Delaware
Continuation-in-part of application Ser. No. 238,701, Nov. 19, 1962. This application Apr. 3, 1969, Ser. No. 813,248
Int. Cl. H01l 7/00; H01v 1/28
U.S. Cl. 136—203 42 Claims

ABSTRACT OF THE DISCLOSURE

Thermoelectric semiconductor elements are formed of ultrafine powders of particle sizes of 50 microns or less. In a first species of element, the particle sizes range between 0.1 micron and 50 microns and are only superficially sintered so that the interconnecting neck sections have cross-sectional dimensions of the order of the mean free path of a phonon in the material, or of the order of 100 angstrom units. In a second species, even finer particles with a mean grain size in the range from 100 to 2000 angstrom units are heavily compressed or compacted together into a densified pill. In both species, the interconnections between adjoining particles include high-angle grain boundaries which result in substantially reduced thermal conductivity and greatly enhanced thermoelectric figure of merit for the resulting continuum.

RELATED APPLICATIONS

This application is a continuation-in-part of a copending application of Mino Green, Ser. No. 238,701, filed Nov. 19, 1962, now abandoned, which in turn is a continuation-in-part of a now-abandoned earlier application Ser. No. 862,164, filed Dec. 28, 1959 copending therewith, and both assigned to the present assignee.

BACKGROUND OF THE INVENTION

This invention relates to semiconductor devices and more particularly to thermoelectric transducers in which the motive material is a semiconductor material.

It is well known in the art that numerous semiconductor materials possess significant thermoelectric properties, and that such materials may be employed to generate electricity in response to applied heat or to produce a cooling effect (refrigeration) in response to applied electrical energy. In the field of refrigeration, for example, the use of thermoelectric principles leads to the possibility of producing refrigerators without moving parts and with no fluid refrigerants. In the field of electric power generation, thermoelectricity presents numerous attractive possibilities, not the least of which is that of an electric power generator without moving parts. In short, the potential impact of thermoelectricity on industry and the public alike is well recognized, and a great deal of effort is being directed to the commercial utilization of the advantageous properties of thermoelectric devices. Before the present invention, however, the maximum obtainable efficiencies of thermoelectric transducers have been too low to permit the construction of commercial thermoelectric devices capable of competing with corresponding devices of conventional construction.

Among the most efficient thermoelectric materials are some of the semiconductor materials; for example, of those so far reported in the literature none has a greater overall efficiency as an electric power generator than doped lead telluride, and the highest thermoelectric figures of merit for bulk semiconductor materials are those of bismuth telluride and of certain alloys of this material with antimony telluride. Yet even the best of the known materials is capable of realizing an optimum thermoelectric efficiency of only slightly over 4% when operating with a thermal differential of 200 degrees Kelvin and with the cold junction at about room temperature. With such low optimum thermoelectric efficiency, the cost, complexity, and operating expense of thermoelectric transducers render such devices substantially inferior, from a commercial point of view, to conventional power generation and refrigeration equipment.

As is well known, the optimum obtainable efficiency with a thermoelectric material is dependent upon three of the basic properties of the material. These are the thermoelectric power or Seebeck coefficient S, the specific electrical resistivity $\rho$, and the specific thermal conductivity K. A thermoelectric "figure of merit" Z for any given material is defined as the square of the Seebeck coefficient divided by the product of the specific thermal conductivity and the specific electrical resistivity of the material. In equation form:

$$Z = S^2/\rho K \quad (1)$$

The optimum thermoelectric efficiency is, in general, proportional to the thermoelectric figure of merit of the material; in addition, in any practical device, the optimum efficiency is generally proportional to the Carnot efficiency, so that the temperatures of the hot and cold junctions are significant. Accordingly, an ideal thermoelectric material should have a high thermoelectric figure of merit Z and should be operable over a wide temperature range.

As previously pointed out, the thermoelectric figure of merit of a material is directly proportional to the square of the thermoelectric power or Seebeck Coefficient, and inversely proportional to the product of specific electrical resistivity and specific thermal conductivity. Much of the research effort toward improving the thermoelectric figure of merit of materials has been directed to decreasing the specific electrical resistivity without corresponding degradation of the thermoelectric power. In the semiconductor field a great deal of progress in this direction has been accomplished through special doping and other processing techniques, but insufficient improvement has been realized to attain the desired operating efficiencies.

To summarize, efforts to increase the thermoelectric power or Seebeck Coefficient of known thermoelectric materials have produced substantial increases in the thermoelectric figure of merit but appear to have reached a limit below the threshold of widespread commercial practicality. Efforts to increase the thermoelectric figure of merit by reducing the product of specific electrical resistivity and specific thermal conductivity have not been highly successful, and even the best prior art thermoelectric generating materials do not possess a sufficiently high figure of merit to lead to the production of commercially competitive thermoelectric transducer devices.

Accordingly, it is a principal object of the present invention to provide a new and improved thermoelectric transducer material.

Another object of the invention is to provide a semiconductor device with a substantially enhanced thermoelectric figure of merit.

Another object of the invention is to achieve a substantial improvement in the thermoelectric figure of merit of a semiconductor material by reducing the product of specific electrical resistivity and specific thermal conductivity of the material.

In the embodiments described in the above-identified prior applications, particles of thermoelectric semiconductor material with grain sizes in the range from 0.1 to 50 microns are pressed or lightly sintered to form extremely narrow interconnecting necks of widths of the order of the phonon mean free path in the material. While the resulting continuum may be maintained intact with extremely careful handling, it is undesirably fragile. Moreover, a mass so formed contains a larger proportion of voids or dead spaces within its pores, and since the thermoelectric properties of the continuum are dependent almost entirely on the thermal resistivity and other properties at the neck regions, it is necessary to encapsulate the material in vacuum or other high thermal resistivity medium to avoid the formation of thermal shunts which would otherwise destroy the thermoelectric efficiency. Vacuum encapsulation is, of course, a well known technique, but the avoidance of any necessity for adopting such measures is a highly desirable objective in adapting thermoelectric transducer elements to commercial use.

It is a further object of the invention to provide a new and improved thermoelectric transducer material which is mechanically rugged and durable while providing a substantially enhanced thermoelectric figure of merit.

Yet another object of the invention is to provide a new and improved semiconductor transducer element which exhibits a substantially enhanced figure of merit in air, without the necessity of vacuum or other encapsulation techniques.

A thermoelectric transducer material, in accordance with the invention, comprises a continuum composed of grains of thermoelectrically responsive semiconductor material, individually of a particle size in the range from 100 angstrom units to 50 microns, bonded together through high-angle grain boundaries to provide a thermoelectric figure of merit substantially greater than that of the semiconductor material in bulk.

The features of the present invention which are believed to be novel are set forth with particularity in the appended claims. The organization and manner of operation of the invention, together with further objects and advantages thereof, may best be understood by reference to the following description taken in connection with the accompanying drawings, in which:

Figure 1:
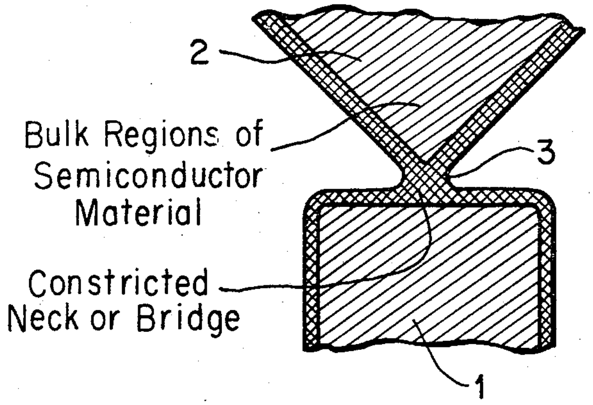
FIG. 1 is a simplified and idealized diagram, to a greatly enlarged scale, of a fragment of a thermoelectrc semiconductor material constructed in accordance with a first embodiment of the present invention.

Before proceeding with a discussion of the invention, and the manner in which the recited objectives are achieved, it may be helpful to consider briefly the mechanism of heat transfer in materials of different types. It is well known that metals conduct heat by electron conduction, in a manner quite analogous to that in which they conduct electric current. Heat transfer in such materials is highly efficient, and in general, the thermal conductivity and the electrical conductivity are well correlated. Thus, an exceptionally good conductor of electricity such as copper or silver also exhibits exceptionally high thermal conductivity.

On the other hand, materials such as asbestos are electrical insulators because the number of free electrons in each unit volume of such materials is extremely low. However, the material is by no means a perfect thermal insulator, and it is now generally accepted that such thermal conduction as does occur in insulating materials is effected by crystal lattice vibrations within the material. To facilitate analysis it has been convenient to express such crystal lattice vibrations in terms of particle analogues; to this end, a unit lattice vibration is termed a phonon. In an insulator, then, such heat transfer as does occur is effected almost entirely by phonon conduction.

Semiconductor materials, in general, have electrical properties falling between those of insulators and those of metals. For the usual range of free carrier mobilities and at carrier concentrations below about $4\times10^{18}$ carriers per cubic centimeter, the electronic component of thermal conductivity is near zero; the lattice component is independent of carrier concentration and is generally of greater significance in its effect upon thermoelectric figure of merit of a semiconductor material.

In accordance with the present invention, it has been found that substantial enhancement of the thermoelectric figure of merit of thermoelectrically responsive semiconductor materials, such as lead telluride, lead selenide, bismuth telluride, or various alloys or mixtures of such materials, may be achieved by powdering the bulk material into grains or particles of ultrafine and preferably submicroscopic size and bonding them together through high-angle grain boundaries, which are regions of highly distorted lattice configuration produced when extremely fine crystalline powders are compacted, sintered or otherwise formed into a coherent mass.

Either of two structural configurations may be employed. In the first, grains or particles of a size in the range from 0.1 micron to 50 microns may be formed into coherent mass in such a way as to produce between adjacent particles interconnecting bridges or necks which are much smaller than the grains of starting material and which contain high-angle grain boundaries. With such a configuration, as described in detail in the previous applications, the thermoelectric properties of the continuum are substantially dependent on the corresponding properties of the necks; the larger bulk regions corresponding to the particles of starting material are virtually insignificant owing to the geometric considerations on a superatomic scale. In another and preferred configuration, even finer grains of starting material, with a mean gain size in the range from 100 to 2000 angstrom units and perferably as near as possible to the smaller end of this range, are compacted into a highly densified continuum, thus creating high-angle grain boundaries along all thermal conduction paths at correspondingly small intervals or repeat distances. With this configuration, the thermoelectric properties of the resulting continuum represents a weighted average between those of the grains of starting material and those of the high-angle grain boundaries, with the latter becoming more significant as the repeat distance is reduced. In the ensuing text, embodiments in the first category will be described in essentially the same terms as in the above-identified prior applications, after which illustrative embodiments falling in the second and presently preferred category will be presented in full detail.

For greater ease in visualizing some of the concepts involved, reference may be made to the accompanying drawing, in FIG. 1 of which is shown in greatly simplified and idealized form a pair of bulk regions 1 and 2 bonded together by an interconnecting neck region 3. Bulk regions 1 and 2 may be considered to be cube-shaped particles of approximately 1 micron in each dimension, while interconnecting neck region 3 may be considered to be a circular cross-section neck of a diameter of about 100 angstrom units. Let us also assume that bulk regions 1 and 2 are particles of p-type semiconductor material, and the interconnecting neck 3 is formed for example by surface-sintering or cold-pressing particles 1 and 2 together.

As is characteristic of such materials, each of the particles 1 and 2 has accentuated surface conductivity owing to mobile space charges trapped immediately beneath the surface. These mobile trapped space charges in p-type semiconductor are "holes" and are designated by the shaded surface areas in the drawing. With a constricted neck region of a diameter of about 100 angstrom units, the space charges of the mother particles 1 and 2 converge in the restricted neck region, with the result that the neck 3 in effect becomes a *p+* semiconductor material and the electrical resistivity of the neck region is greatly reduced relative to that of bulk regions 1 and 2.

In effect, then, the formation of an interconnecting neck of an accentuated charge carrier conductivity relative to that of the bulk particles results in a "channel" for electric current flow which is wider or larger than that provided for heat flow. The size or capacity of the electrical "channel" may be estimated to exceed that of the thermal "channel" (the physical neck itself) by about twice the effective space charge thickness; for example, the effective diameter of the electrical "channel" between particles 1 and 2 may be about 200 angstrom units in the configuration shown in the drawing. This corresponds to a reduction in electrical resistivity by approximately a factor of two, without changing the thermal conductivity K.

Consideration must now be given to the distribution of temperature in the neck region bearing in mind that the voltage developed in response to a temperature difference $\Delta T$ is $S\Delta T$ and moreover that the value of S is correlated with the thermal conductivity K of the material. Now, if there is a total temperature drop $\Delta T$ from the center of bulk region 1 to the center of bulk region 2 through the neck, it may be shown by mathematical analysis that approximately half of this temperature drop occurs in the enhanced space charge region in the vicinity of the neck, while the other half occurs in the bulk semiconductor regions. The total thermoelectric voltage generated in response to the temperature drop $\Delta T$ is then defined by adding the voltages produced by the bulk regions over a temperature drop of $\frac{1}{2}\Delta T$ and the voltage produced in the neck over a corresponding drop. Since, for purely geometrical reasons, the thermal conductivity in the neck is reduced relative to that of the bulk material, the thermoelectric power or Seebeck coefficient S is somewhat lower in the neck than it is in the bulk regions. But this degradation in thermoelectric power in the neck, even when squared in Equation 1 to ascertain the thermoelectric figure of merit, is less significant than the improvement in the electrical resistivity which has been reduced by substantially a factor of two.

With the configuration shown in the drawing, the thermoelectric figure of merit is also increased because of phonon scattering in the neck. Phonon scattering occurs for two principal reasons. In the first place, phonons are scattered by bulk dislocations and imperfections in the neck which are inherent and unavoidable in bonding the bulk regions together; these constitute high-angle grain boundaries in which the lattice configuration is highly disordered. Secondly, since the diameter of the neck is only about 100 angstrom units, it is comparable in size with the average phonon mean free path. It will be remembered from the foregoing discussion that a phonon is a particle analogue and is defined as a unit crystal lattice vibration. As a matter of known scientific fact, the phonon spectrum in semiconductor materials covers a wide range of frequencies or wavelengths, and each phonon has a mean free path in the material which may be defined as the average distance that the phonon may travel without a collision with another phonon. The average phonon mean free path in semiconductor materials at room temperature may be as low as 25 or as high as several hundred angstrom units. The average phonon mean free path varies inversely with temperature, and as used herein the phonon mean free path is that at the operating temperature of the material.

As previously pointed out, heat transfer is effected in a bulk semiconductor material principally by phonon conduction. In such a bulk material, with crystal dimensions large relative to the average phonon mean free path, phonon flow is substantially unimpeded and the specific thermal conductivity is that characteristic of the bulk material. In a thermoelectric transducer material constructed in accordance with FIG. 1, however, heat transfer across the narrow semiconductor bridges or necks between the individual bulk regions or particles, which also takes place predominantly through phonon conduction, is impeded because of crystal lattice discontinuities at the high-angle grain boundaries in the neck regions and also because the necks are not substantially wider than the length of an average phonon mean free path in the material. With this construction, phonons entering the bridge or neck scatter with a resultant decrease in the phonon conduction through the bridge. This results in a substantial reduction in specific thermal conductivity relative to that of the bulk material; in actual practice, the specific thermal conductivity may be reduced by a factor of 2 to 5 or even more. On the other hand, the specific electrical resistivity of the neck is not substantially increased, and as pointed out above, may even be substantially reduced by convergence of the mobile trapped space charges. Accordingly, a substantially enhanced thermoelectric figure of merit is realized.

Thus, in summary, a first species of thermoelectric transducer material constructed in accordance with the present invention comprises bulk regions of semiconductor material bonded together by interconnecting constricted necks, also of semiconductor material, of such size and configuration that the thermal and electrical properties of the resultant continuum are determined primarily by the properties of the necks. With constricted necks of a diameter of the same order of magnitude as the average phonon mean free path in the mother material, the specific thermal conductivity is reduced by phonon scattering caused both by bulk dislocations and imperfections (e.g., disordered lattice configurations at the high-angle grain boundaries) in the necks and by diffraction effects attributable to the geometrical configuration; since the thermoelectric figure of merit is inversely proportional to the specific thermal conductivity, this leads to a substantial improvement in the thermoelectric figure of merit relative to that of the mother material. Moreover, by employing p-type semiconductor materials, the specific electrical resistivity may be substantially reduced owing to convergence of the trapped mobile space charges beneath the surfaces of the bulk regions. This leads to a condition in which the thermal gradients differ substantially from the potential gradients, so that the specific electrical conductivity and the specific thermal conductivity are differentially changed relative to the corresponding properties of the bulk material. It is by virtue of the differential changes in these properties of the sintered material that a substantially enhanced thermoelectric figure of merit is achieved. Considered in another light, the ratio of electrical conductivity to thermal conductivity in a transducer material constructed in accordance with the present invention is substantially greater than that of the mother semiconductor material in bulk. Since the thermoelectric figure of merit is proportional to the ratio of electrical conductivity to thermal conductivity, this results in a substantial and material improvement in the figure of merit; preliminary experiments have indicated that improvements as high as 300% to 500% may be achieved.

In order to improve the thermoelectric properties of the material it is desirable to achieve a maximum ratio of electrical to thermal conductivity, and in particular this ratio must be greater than the ratio in the corresponding bulk material. Optimization occurs when the electrical resistivity of the sintered mass is within the range from 2 to 200 times the resistivity of the bulk material. Of course, the specific location within this range will change with the particular material being processed.

Further enhancement in the thermoelectric figure of merit of a transducer material constructed in accordance with the present invention may also be achieved. For example, the continuum may be formed by surface-sintering together mixed particles of two or more different semiconductor materials. This may lead to further enhancement of the thermoelectric figure of merit for two reasons: first, with bulk regions of different semiconductor materials, the resultant phonon refraction may lead to increased phonon scattering, and secondly, in the process of surface-sintering the particles together, the two materials may be alloyed in the neck region to produce a thermoelectric material having an inherently higher figure of merit than either of the mother materials. In this connection, it is known for example that an alloy of bismuth telluride and bismuth selenide or lead telluride and lead selenide possesses an inherently higher thermoelectric figure of merit than either of the mother materials.

One method by which a construction of the type herein described may be produced is by pulverizing the bulk material into discrete fine particles of several microns in diameter. These particles may then be compacted without compressing them, as by mechanical agitation at an audio or ultrasonic frequency. After shaking the particles into a compacted mass of from 50% to 80% of the bulk density of the material, heat may be applied to surface-sinter the particles together.

The advantages, and specifically the improvement in the thermoelectric figure of merit, of a construction in accordance with the invention have been actually verified by the fabrication of such a construction from a mother material consisting of p-type germanium. Specifically, a bar of gallium-doped polycrystalline p-type germanium, having a specific resistivity of $5\times10^{-3}$ ohm-centimeters, was ground as finely as possible by hand with an agate mortar and pestle. The resulting particle sizes were estimated to range from $\frac{1}{10}$ to 10 microns in length. The powder thus prepared was placed in a "Vicor" (high melting point refractory) silica glass vacuum system. The receptacle was then evacuated to a pressure of $10^{-6}$ millimeters of mercury and shaken after evacuation to compact the powder. This vibration and compacting operation was repeated until the ultimate density of the powder aggregate was approximately 63% of the bulk density of the mother material. The powder aggregate was then heated in vacuum to a temperature of about 850° C. for approximately one hour, to first cleanse the particle surfaces of the oxide coatings and then surface-sinter the particles together to form the narrow semiconductor bridges.

The resistivity of the resulting sintered mass was directly measured and found to be about 1 ohm-centimeter, as compared to a resistivity of $5\times10^{-3}$ ohm-centimeters in the bulk material. The specific thermal conductivity, by direct measurement and calculation, was found to be $1.5\times10^{-4}$ calories per centimeter per degree Kelvin as compared to a figure of $1.5\times10^{-1}$ expressed in the same units for the bulk material. The thermoelectric power or Seebeck Coefficient of the powder was substantially the same as that of the bulk material. Consequently, an improvement in thermoelectric figure of merit corresponding to a factor of 5 was realized.

Further verification of the effectiveness of the invention in improving the figure of merit of semiconductor thermoelectric materials has been attained with p-type lead telluride. The original or mother material was lead telluride doped with sodium to have the characteristics specified hereafter. This material was similarly processed, being first ground in air to a particle size in the range of 0.5 to 50 microns. Thereafter, the powdered material was placed in a vessel which was evacuated to pressure of about $10^{-6}$ millimeters of mercury and vibrated to compact the powder to a density of approximately 55% of the bulk density of the mother material. Following this, the material was sintered by being subjected to an elevated temperature which was low compared to the melting temperature. This process was carried out for two samples of the material and the change in characteristics is apparent from the following table in which are recorded the significant figures for the mother material and for each of the two batches after sintering.

| | Mother material | Sample No. 1 | Sample No. 2 |
|---|---|---|---|
| Electrical resistivity (ohm-centimeters) | $1.1\times10^{-3}$ | $10\times10^{-2}$ | $1.33\times10^{-2}$ |
| Thermal conductivity (watts/° C. centimeter) | $360\times10^{-4}$ | $0.313\times10^{-4}$ | $2.01\times10^{-4}$ |
| Seebeck coefficient (microvolts/° C.) | 90 | 132 | 195 |
| Figure of merit (per ° C.) | $2.05\times10^{-4}$ | $5.56\times10^{-3}$ | $14.2\times10^{-3}$ |
| Sintering conditions | | (1) | (2) |

[1] 2 hrs. at 182° C.
[2] 3 hrs. at 300° C.

It is apparent from comparing the values for figure of merit that the thermoelectric properties of both samples were markedly improved. To retain these enhanced properties, the element is to be enclosed in a medium that has a very much lower thermal conductivity than the sintered material. This may be accomplished by encapsulating the element in a vacuum, and ensuring that the container walls do not form a significant thermal shunt path.

Figure 2:
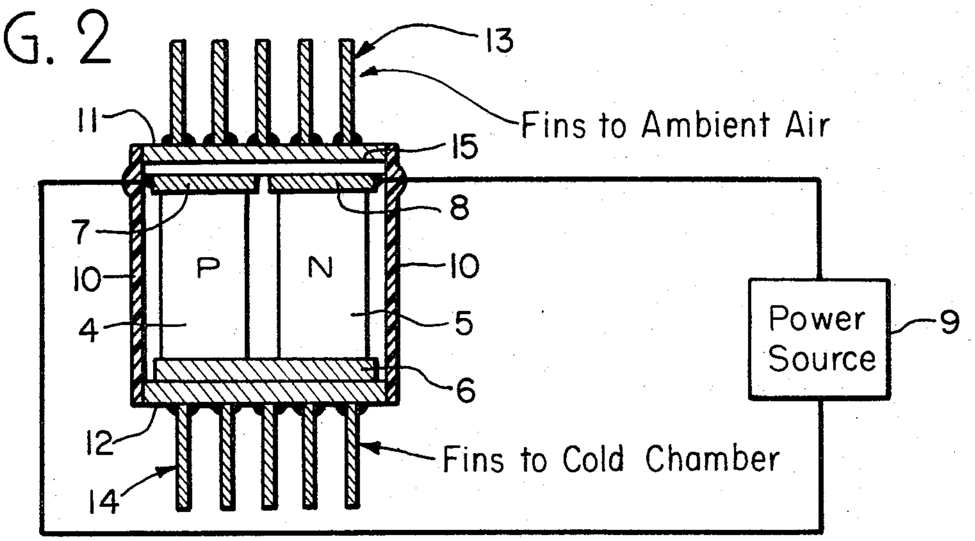
FIG. 2 is a cross-sectional view of a thermoelectric refrigeration device embodying the improved semiconductor transducer material of FIG. 1.

By way of illustration, a thermoelectric refrigerator utilizing the improved thermoelectric material may be constructed as illustrated in FIG. 2. It comprises thermal elements 4 and 5 interconnected at one end by a flat strip 6 of conductive material such as copper or aluminum. Element 4 is a p-type lead telluride material which has been treated in the manner described above to have a high figure of merit and element 5 may be an n-type semiconductor thermoelectric material which has also been processed to improve its thermoelectric properties or it may even be one of the known forms of commercially available n-doped bismuth telluride. The opposite ends of elements 4 and 5 terminate in metal connectors 7 and 8 of copper or aluminum which are electrically connected to the terminals of a power source 9 for supplying the direct current which is necessary in a thermoelectric refrigerating device. The circuit connections to thermal elements 4 and 5 must be low resistance in order to realize full advantage of the device. Moreover, the thermal elements are to be encased in a thermally non-conductive medium, that is to say, the enclosing medium must have a thermal conductivity which is less, and, preferably substantially less than that of the thermal elements. This prevents the establishment of a thermal-short-circuit around the constricted neck regions of the thermal elements which would drastically reduce the thermoelectric figure of merit. A variety of ways suggest themselves for preventing such short-circuits. For example, the thermal elements may be encapsulated in a vacuum vessel or while any such element is in a vacuum it may receive a surface coating which, when set, seals the element to preserve an internal vacuum condition. However, as shown, elements 4 and 5 are enclosed in an air tight, evacuated structure composed of thin side walls 10 of electrically non-conductive and thermally poorly conductive material such as glass, and end walls in the form of metal slabs 11 and 12 to which fins 13 and 14 are attached. Members 11, 12, 13 and 14 are to be good thermal conductors and may be constructed of aluminum. Metal slab 11 is insulated from connectors 7 and 8 by an interposed sheet 15 of electrical insulation such as aluminum oxide which prevents short-circuiting of power source 9.

The described arrangement is a rudimentary thermoelectric refrigerator in which metal connectors 7 and 8 are the hot junctions and metal connector 6 is the cold junction. The transfer of heat from connector 6 to connectors 7 and 8 takes place in accordance with the well-known Peltier effect.

In operation, fins 14 extend into a cold chamber and extract heat therefrom and this heat is dissipated in the ambient air by means of fins 13. Current from power source 9 flowing through elements 4 and 5 initiates the Peltier effect which, in essence, pumps heat from one set of fins to the other.

In the transducer elements described above and in the previously identified copending applications, the enhancement of the thermoelectric figure of merit was originally thought to require the provision of a continuum in which the interconnecting necks or bridges between adjacent particles were much smaller in their transverse dimensions than the particle sizes employed. The enhancement of the figure of merit was thought to be attributable primarily to differential modifications of the electrical and thermal conductivities, an enhanced electrical conductivity being realized by converging surface space charge layers in the narrow necks and reduced thermal conductivity being obtained by phonon scattering due to the provision of neck sizes comparable to the average mean free path of phonons in the material employed. It was recognized that some phonon scattering in the necks would result from bulk dislocations and imperfections produced inherently and unavoidably in bonding the particles together, but at that time this was not known to be a major factor in realizing the desired enhancement of the figure of merit. Subsequent research has led to the realization that in the process of forming the lightly compacted masses, high-angle grain boundaries are inherently produced in the necks, and that this creates a highly disordered lattice structure in the necks which strongly impedes phonon transfer between adjacent particles. Indeed the reduction in thermal conductivity attributable to the disorder in the lattice configuration has now been determined to be greater than that occasioned by the superatomic geometrical considerations elaborated in the previous applications. In reality, it is the increased thermal resistivity of the high-angle grain boundaries which is principally responsible for the improved results reported. A review of the underlying physical considerations as now understood will follow.

When a crystalline material is pulverized, the resultant powder particles are generally simple in shape. Lead telluride, for example, has a simple cubic crystal structure with cleavage planes which give rise to particles shaped as rectangular parallelepipeds. In contrast, a substance, such as germanium yields particles in the shape of a truncated pyramid.

Whatever the shape, the greatest length of a powder particle is seldom more than twice its smallest dimension. When powder particles are placed together to form a powder mass, individual powder particles touch each other, and for the most part the individual contacts are as points touching planes. The passage of heat or electricity through a powder mass requires that the heat or electricity pass from particle to particle through these contact points. The resultant thermal or electrical conductivity of a powder mass will be determined by two major factors. The first factor, the geometrical factor, is concerned with the size and shape as well as the statistical distribution of the points of contact between particles. The second factor, the physical properties factor, is concerned with the physical properties of the material at and in the vicinity of the contact points between particles. The physical properties of a solid are drastically modified in the region of a point of contact, and this fact can have considerable significance with respect to the properties of solids useful for thermoelectric refrigeration or thermoelectric power generation.

The points of contact between powder particles in a powder mass can be enlarged by the application of pressure or by heating the powder mass or by a combination of heat and pressure. In any case, the process of enlarging the points of contact may be called "sintering." A powder mass sinters under its own weight, to produce necks of exceedingly small cross-sectional area. The mechanism of sintering can be attributed to viscous flow, volume diffusion, surface diffusion, vapor transport, or various combinations of these phenomena. No matter how the necks are formed, however, there is created a zone of crystal disorder across the neck joining two powder particles. The zone of disorder arises from the fact that the crystallographic axes of touching powder particles are disoriented with respect to each other. This zone of disorder is called a high-angle grain boundary because it is situated at the boundary between adjacent grains, and because the angular displacement of adjacent grains is substantial, i.e., from 10 to 45 degrees.

Figure 3:
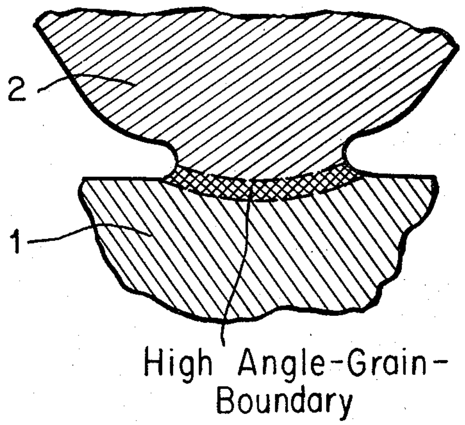
FIG. 3 is an enlarged detail of a high-angle grain boundary in the material of FIG. 1.

Nearly all the information necessary for understanding the properties of a sintered powder mass can be gained by examining the properties of a single neck region. FIG. 3 schematically represents the cross-section between two particles which have been sintered together by viscous flow. For either heat or electricity to pass through a continuum of such a sintered powder mass, such heat or electricity must pass through the necks as well as through the particles, and accordingly the neck properties as well as the bulk properties must be determined to permit an understanding of the behavior of the sintered powder mass.

Thermal conductivity will be considered first. As pointed out previously, there are two components of thermal conductivity, namely, the lattice or phonon component and the electronic component. The bulk properties are well known and understood, but the thermal conductivity in the disorder zone, in the high-angle grain boundary, is more difficult to ascertain.

If one were to try to construct a model of a high-angle grain boundary so that the constituent atoms of the crystal lattice are displaced as little as possible, it soon becomes apparent that there are a very large number of vacancies or missing atoms in the lattice in the high-angle grain boundary simply because of the angular relationship between the crystallographic axes of the adjacent particles and the fact that an abrupt transition must be made from an ideal crystal on one side of the neck to another differently oriented ideal crystal on the other. A reasonable supposition is that the extent of the disorder may be about two monolayers of vacancies distributed in a zone about 10 atoms thick, producing an amorphous zone of material about 20–40 angstrom units thick. It seems reasonable to assume, and experimental evidence tends to confirm, that the thermal conductivity of this amorphous zone is in the range of values typical of liquid materials or perhaps of the order of $2\times10^{-3}$ watt units, as compared with about $2\times10^{-2}$ watt units for the bulk material.

The thermal resistance of a neck may be expressed in two terms, the geometrical term due to the spreading resistance and the physical properties term arising from the disordered disc of material represented by the high-angle grain boundary. This may be expressed in equation form as follows:

$$R_T=\frac{l}{K_B d}+\frac{41}{K_D \pi d^2} \qquad (2)$$

where $R_T$ is the total thermal resistance of a neck, $K_B$ and $K_D$ are the thermal conductivities of the bulk and disordered regions respectively, $d$ is the neck diameter, and $l$ is the thickness of the high-angle grain boundary or the disordered region. As an example, if $K_B$ equals $2\times10^{-2}$ and $d$ equals 100 angstrom units, and if $l$ is estimated at 35 angstrom units and $K_D$ at $2\times10^{-3}$, then the geometrical component of neck resistance becomes $5\times10^{-7}$ and the physical properties term becomes $22.3\times10^{7}$, which provides an increase in thermal resistance in the neck over the bulk material by a factor of approximately 5.5.

The thermal conductivity $K_s$ of a powder mass may be expressed to a good degree of approximation by the relation $$K_s=l/R_T D \qquad (3)$$

where D is the mean powder particle diameter. If $R_T$ is $27.3\times10^{-7}$ as estimated above, and if mean powder particle size is $3\times10^{-4}$ centimeters or three microns, the thermal conductivity of the mass $K_s$ becomes $1.22\times10^{-5}$ watt units.

Consideration will next be given to the electrical properties in the necks and in the high-angle grain boundaries. Electrical conductivity and thermoelectric power are closely interrelated in determining the overall figure of merit of a semiconductor. The presence of the disordered zone at the high-angle grain boundary must necessarily reduce carrier mobility because of the extra scattering of the carriers arising from the disorder. This extra scattering in turn increases the thermoelectric power. In fact, provided the extra scattering is not more than about 30%, there is an almost exact compensation in the two effects so that $S^2/\rho$ remains essentially constant.

In the case of lead telluride and also most other compound semiconductors, the disordered zone contains a high and nearly equal concentration of donor and acceptor centers. It can readily be demonstrated that a very high concentration, of the order of $10^{19}$ per cubic centimeter, of donor and acceptor centers will clamp the Fermi level at the center of the energy gap if the donor concentration is equal to the acceptor concentration. If there is a slight excess of donors, then the material will go n-type and if acceptors exceed donors the material will go p-type. In the case of lead telluride which has been ground and consolidated in vacuum, it has been established experimentally that the observed thermoelectric power is large and positive and almost independent of whether the bulk of the particle is n-type or p-type. For lead telluride, the carrier concentration in the high-angle grain boundaries of the necks should preferably be of the order of $3\times10^{18}$ carriers per cubic centimeter; this yields a near optimum value of $S^2/\rho$. With a 100 angstrom unit neck size and a 5.5 improvement in thermal resistance, Z's of the order of $5\times10^{-3}$ may be predicted; experimental results for lead telluride indicate that Z values of $10\times10^{-3}$ or even a little higher may be obtained.

From the foregoing analysis, it is apparent that extremely small neck diameters are required in order to obtain any substantial enhancement of the thermoelectric figure of merit. In the configurations of the prior applications, such neck sizes are obtained by only superficially sintering ultrafine particles of a mean grain size in the range from 0.1 micron to 50 microns. The resulting continuum is of a fragile nature and while it is possible to handle and encapsulate such units, great care must be taken to avoid destructive rupture. In an alternate and presently preferred embodiment of the invention, even finer powder particles, submicroscopic in size (i.e., in the range from 100 to 2000 angstrom units) are heavily compacted under high pressures into a dense pill of great mechanical stability. In this configuration, the individual grain sizes are of the same order of magnitude as the required neck sizes, and the high-angle grain boundaries come at sufficiently frequent intervals so that their enhanced thermolectric properties provide a significant improvement in the resultant thermoelectric figure of merit of the compacted mass.

Figure 4A:
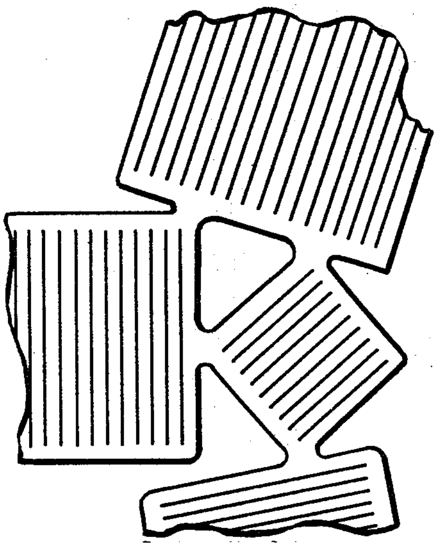
FIGS. 4A, 4B and 4C are idealized and simplified diagrams of another and preferred form of thermoelectric transducer material embodying the invention.

When the extremely fine-grained powders are compacted, sintered or otherwise formed into a coherent mass, the relative orientations between corresponding crystal lattice planes are randomly distributed. The principal thermoelectric semiconductor materials are crystalline in nature so that only in a statistically insignificant number of compacted particle pairs are the lattices of adjacent particles in parallel or near parallel alignment. Several such particles are shown on a greatly enlarged scale in FIG. 4A, each of the particles being illustrated as cubic in view of the cubic or square cornered lattice configuration, and adjacent particles are illustrated as being in randomly distributed edge or corner contact. When such a powder is compacted into a dense mass, with or without the application of heat, high-angle grain boundaries are formed at the contacting areas because on a statistical basis, corresponding lattice planes of adjacent particles are tilted and skewed with respect to each other at varying angles most of which are in excess of 10°. When the lattices of adjacent particles are bonded together in such misalignment, the lattice continuity at the grain boundary is severely disordered and contains atomic vacancies as well as displaced atom sites. An extremely disordered lattice configuration at the high-angle grain boundary constitutes a bulk dislocation which substantially impedes thermal conduction by phonon scattering. The thickness of the disordered region at a high-angle grain boundary varies only slightly with the composition of the semiconductor material employed and is approximately 40 angstrom units for lead telluride. In a highly densified aggregate having a mean grain size of 120 angstrom units, for example, approximately one third of the total length of each thermal conduction path contains lattice disorders attributable to the high-angle grain boundaries, and to a rough degree of approximation, the thermal resistivity of the compacted mass is a weighted arithmetic mean of the thermal conductivities of the bulk material and of the high-angle grain boundaries. For lead telluride, compacted masses with thermal conductivities of $1\times10^{-3}$ watt units in the high-angle grain boundaries have been obtained, as compared with $20\times10^{-3}$ prevalent in the intervening bulk regions.

Figure 4B:
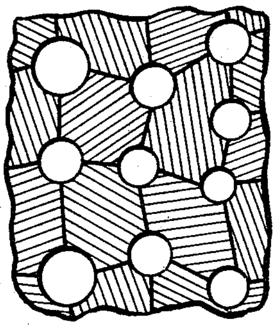
Figure 4C:
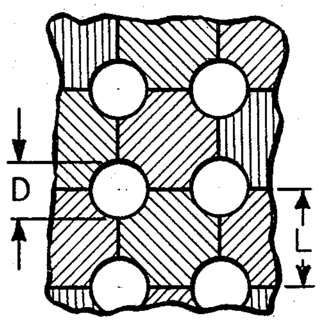

On heating the mass, the void volumes which are all initially interconnected (and this is confirmed experimentally by surface area measurements) become isolated as a result of material transport. The resulting mass may be as shown in FIG. 4B and may be further idealized in the manner shown in FIG. 4C.

It will be recalled that the expression for the figure of merit (Z) of a thermoelectric material is given by:

$$Z=S^2/\rho K \qquad (1)$$

where S is the thermoelectric power, $\rho$ is the electrical resistivity and K is the thermal conductivity of the material. For a fully compacted semiconductor mass embodying the invention, where free carrier scattering is by lattice vibrations (acoustic mode scattering) we can rewrite the above equation as:

$$Z=\frac{7.45\times10^{-9}\left\{4+4.6\log_{10}\frac{n}{n_b}+\left[2.3\log_{10}\left(\frac{n}{n_b}\right)\right]^2\right\}\sigma}{\left(\frac{K_{L,B}}{1+\frac{x}{L}}\right)+4.5\times10^{-6}\sigma} \qquad (4)$$

where $n_b$ is a parameter constant of the solid, namely the carrier concentration per cubic centimeter corresponding to the effective density of states in the conduction band (for electrons) or the valence band (for holes), and is given at 300° K. by $2.5\times10^{-19}\times(m^*)^{3/2}$, where $m^*$ is the effective mass ratio [$m^*$ for PbTe is 0.25 for electrons and 0.35 for holes]. $n$ is the actual free carrier concentration and $\sigma$ is the electrical conductivity in units of (ohm-cm.)$^{-1}$. $K_{L,B}$ is the lattice thermal conductivity of the bulk semiconductor at 300° K. ($2\times10^{-2}$ watt units for PbTe). L is the mean grain size and is expressed in angstrom units. $x$ is an empirical constant involving the effective thickness of a high-angle grain boundary and the ratio of its thermal conductivity to $K_{L,B}$; for $K_{L,B}$ of approximately $2\times10^{-2}$, this constant will generally be in the range from 1000 to 2000. The constant $4.5\times10^{-6}$ is a universal constant for 300° K. and acoustic mode scattering, and the constant $7.45\times10^{-9}$ is a universal constant. To achieve optimum enhancement of the thermoelectric figure of merit above the value for the bulk material, the mean grain size L must be as small as possible while still larger than the free electrical carrier wavelength in the material (usually about 100 angstrom units). Substantial enhancement of Z has been obtained with mean grain sizes in the range from 100 to 2000 angstrom units.

Figure 5:
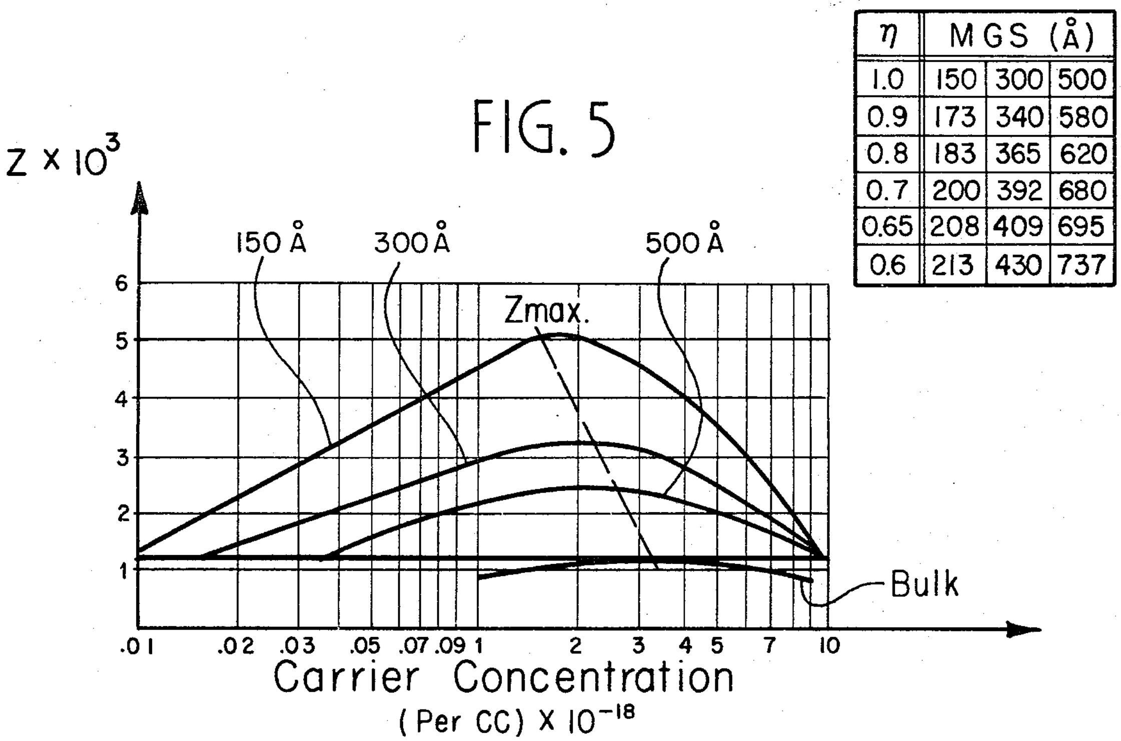
FIGS. 5 and 6 are graphical representations of the thermoelectric properties of the material of FIGS. 4A, 4B and 4C.
Figure 6:
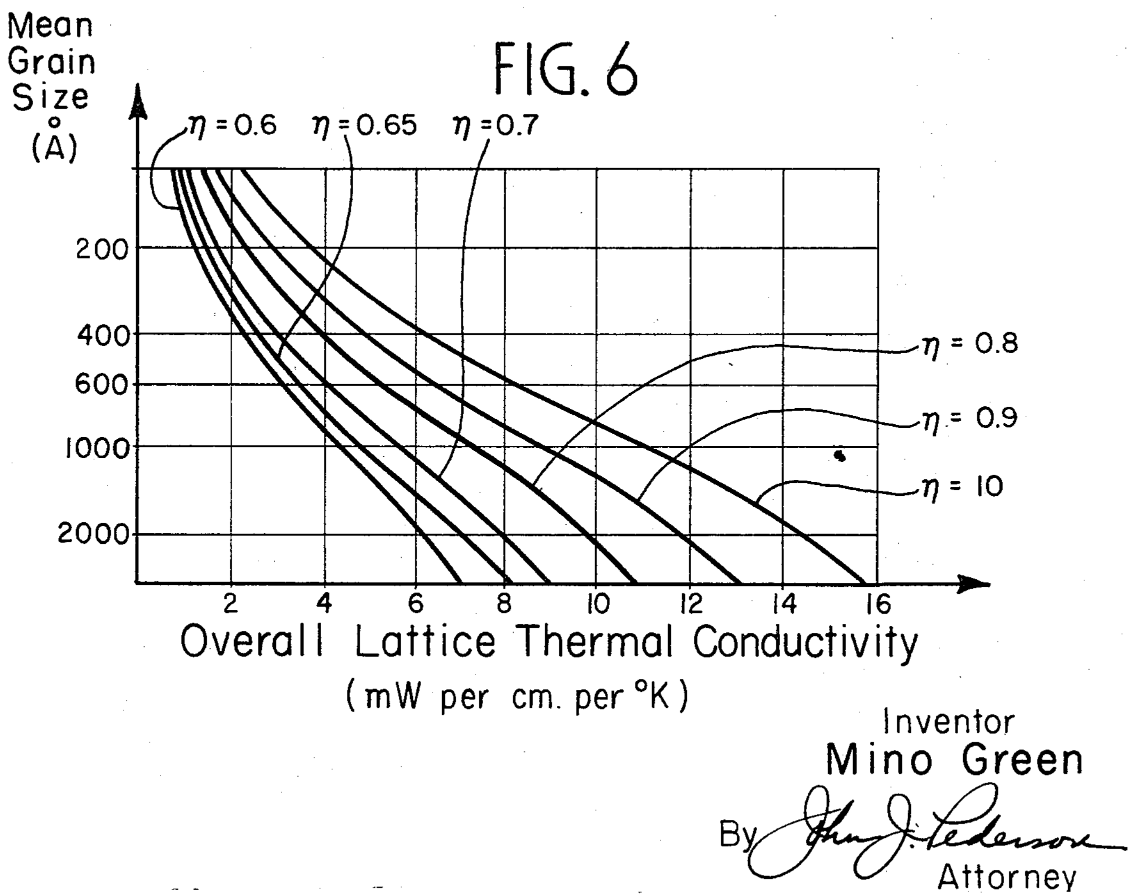

The dependence of thermoelectric figure of merit on mean grain size can be more readily appreciated from the graphs of FIG. 5, in which the thermoelectric figure of merit Z of 100% densified n-type lead telluride pellets embodying the invention is plotted against the electrical carrier concentration on a logarithmic scale for selected mean grain sizes. As may be readily appreciated from the curves, higher figures of merit are achieved with smaller grain sizes for a given doping level, and figures of merit as high as $5\times10^{-3}$ or even higher may be achieved by employing extremely fine particles and appropriate doping concentrations. The mean grain size is the most significant controlling parameter, with a relatively wide permissible variation in doping concentration for near-optimum results for any specified grain size. The undesirable tendency to grain growth as an incident to application of the elevated temperatures required for doping may be at least partially offset by reducing the compaction density $\eta$; this is shown by the table accompanying the curves of FIG. 5 which shows the correlation between these parameters for illustrative figures of merit. The effect of mean grain size on overall lattice thermal conductivity of the continuum including the high-angle grain boundaries, for different compaction densities $\eta$, is shown in FIG. 6. Accordingly, by reducing densification, a given thermoelectric figure of merit can be achieved with larger mean grain sizes L than that specified by Equation 4. This is desirable because of the increased processing difficulties encountered in producing the smaller grain-size powders, and may be attributed to increasing significance of spreading resistance (not reflected in Equation 4) with lower compaction densities. However even with compaction densities of 50 or 60%, the increased spreading resistance attributable to geometric considerations is a second order effect and distinctly secondary to the increased lattice resistivity of the high-angle grain boundaries in achieving an enhanced figure of merit. The corresponding curves and tables for other thermoelectrically responsive n-type semiconductor materials, such as lead selenide, bismuth telluride, and alloys of bismuth telluride with bismuth selenide or antimony telluride are similar, except for a translation of all curves in the Z coordinate direction to reflect differences in the bulk Z of the selected composition. For p-type materials, the family of curves is also translated with respect to the Z coordinate; the curves for p-type lead telluride, for example, are similar to those of FIG. 5 but approximately 20% lower because this material has a maximum bulk figure of merit of only $0.95\times10^{-3}$.

The semiconductor starting materials of the requisite extremely fine mean grain sizes may be prepared either by mechanical grinding processes or by chemical precipitation, although the latter is preferred in the case of lead telluride or lead selenide. A specific process for producing lead telluride with a mean grain size of $160\pm30$ angstrom units is as follows. To make 20 grams of 0.06 mole lead telluride, 7.66 grams of tellurium and 18.6 grams of lead (50% excess over stoichiometric proportions) are dissolved together in 200 milliliters of 1:1 nitric acid and 10 grams of tartaric acid. A separate reducing solution comprising 300 milliliters of hydrazine hydrate, 40 grams of tartaric acid, 500 milliliters of 2-normal ammonia, and 500 milliliters of water, is prepared. The solutions are maintained at room temperature, and the metal solution is added to the reducing solution. The mixture is brought to a boil for one to one and one-half hours and filtered through a medium frit filter while still hot, after which the filtrate is washed with hot distilled water until pH 7 or neutral filtrate is obtained. The material is then washed with acetone and transferred to a vacuum rotary dryer. The resulting extremely fine grains of lead telluride are pyrophoric and must be maintained in vacuum or in an inert gas atmosphere.

A similar process may be employed to produce lead selenide of a similarly small particle size, with all steps of the process being identical except for the substitution of 5.53 grams of selenium and 21.7 grams of lead in the initial metal solution, the process yielding 20 grams of 0.07 mole lead selenide.

To form the powder into a compacted thermoelectric element with suitable electrodes or electrical contacts, a thin bed of metal powder, for instance copper at a depth of about 0.1 centimeter, is placed at the bottom of a die of the desired shape. The fine lead telluride or lead selenide semiconductor powder is then poured into the die under an inert gas atmosphere and the powder is gently pressed flat after which additional metal (e.g., copper) powder is placed on top of the semiconductor powder and the tap punch is placed into position. The charge is brought to a temperature of about 210° centigrade in a vacuum press and compacted at that temperature to a pressure of about 50 tons per square centimeter, after which the temperature is raised to about 300° centigrade for 10 minutes. The system is then allowed to cool and the slug ejected. The resulting mass is in the form of a dense pill which has been doped n-type by in-diffusion of the copper, the pill having low resistance copper end caps on its faces. A small amount of grain growth will have occurred during the elevated temperature steps of the process, yielding an ultimate mean grain size of the order of 300 angstrom units as compared with the starting mean grain size of 160 angstrom units.

To achieve the best results in accordance with the present invention, the compacted microparticle mass should be doped to a uniform carrier (electron or hole) concentration throughout both the individual grains and the high-angle grain boundaries. The optimum carrier concentration $n_{opt}$ is an exponential function of the intrinsic carrier concentration of the starting material and is defined by the following relationship:

$$n_{opt}=n_i e^{\mu_b} \quad (5)$$

where $n_i$ is the intrinsic carrier concentration of the material and for lead telluride, for example, is $1.4\times10^{16}$ carriers per cubic centimeter, $e$ is the universal exponential constant 2.718+, and $\mu_b$ is the position of the Fermi level with respect to the intrinsic energy level in units of $k$T, i.e. $\mu_b=(E_F-E_I)/kT$. Either donor or acceptor doping can be accomplished in any of several ways, as by chemisorption of substitutional diffusers such as bismuth or the halogen atoms as donors or the alkali metals of selenium as acceptor dopants. Interstitial doping may also be employed, as for example, by the use of copper atoms as donors or indium as acceptor dopants; however, the use of interstitial dopants requires elevated temperature processing for sustained time intervals and this leads to undesirable grain growth so that, in general, the use of substitutional diffusers is preferred. Doping may also be achieved by out-diffusion of component atoms to form tellurium or lead vacancies, but again, such out-diffusion generally is accomplished only through the use of sustained elevated-temperature processing with undesirably large attendant grain growth. With lead telluride, for example, grain growth occurs at processing temperatures in excess of 240° centigrdae, and accordingly it is desirable to find a doping process which minimizes processing times at temperatures in excess of 240° C.

To accelerate the in-diffusion or donor or acceptor atoms, the individual particles or grains of starting material may be precoated with appropriate substitutional diffusers to provide the desired conductivity type in the finished material. Thus, for example, the fine particles or grains, after formation either mechanically or by chemical precipitation, are given a final wash in an aqueous solution of a material such as cadmium fluoride before vacuum drying. Upon evaporation of the water, the semiconductor particles retain a surface coating of cadmium fluoride molecules, and subsequent heat treatment of the mass causes the cadmium fluoride to diffuse substitutionally into the crystal lattice structure of the particles, thereby providing n-type doping. By thus dispersing the dopant throughout the powder aggregate, the diffusion time require to achieve uniform carrier concentration in the compacted mass is greatly reduced, and a much smaller amount of undesired grain growth is encountered during the doping process. Other materials which may be provided as individual particle coatings to facilitate n-type doping are bismuth, magnesium fluoride and other halides (chlorides, bromides or iodides) of alkaline earth metals. p-Type dopants include the alkali metals and selenium; these are also substitutional diffusers and are best applied by precoating the individual grains before compaction.

To inhibit grain growth during the doping process, which usually requires elevated temperatures for the semiconductor materials of principal interest, mixtures of two or more ultrafine semiconductor powders may be employed. For example, lead telluride/lead selenide mixtures and bismuth telluride/lead telluride mixtures have been found to be particularly effective in inhibiting undesired grain growth. For best results, such mixtures should be essentially homogeneous with approximately equal numbers of particles of the respective constituents, so as to minimize intergrain contacts between particles of the same composition. Such substantially homogeneous mixtures can be prepared by blending the individual powders in an aqueous suspension in a nitrogen atmosphere, after which the precipitate is removed by filtration and air dried.

The invention provides a substantial and controllable degradation in the lattice component of thermal conductivity as compared with the bulk material, but without substantial change in the product of the electrical conductivity with the square of the Seebeck Coefficient. In thermoelectric refrigeration applications, the lattice component of thermal conductivity is of such greater significance than the electronic component, and accordingly the invention is especially important in the attainment of sufficient thermoelectric efficiencies to compete with mechanical refrigeration equipment. The invention provides a less significant figure of merit enhancement in materials and transducers for use in electric power generation, due to the greater dependence of such materials on the electronic component of thermal conductivity, and to the fact that this component is not materially improved, but the obtainable enhancement may still be useful in the power generation field.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A thermoelectric transducer element comprising bulk regions of semiconductor material, individually of a size in the range from 0.1 to 50 microns, only superficially sintered together to provide a thermoelectric figure of merit substantially greater than that of said semiconductor material in bulk and enclosed in a medium having a thermal conductivity substantially less than that of the sintered material.

2. A thermoelectric transducer element comprising bulk regions of semiconductor material bonded together by constricted semiconductor necks to constitute a continuum in which characteristic cross-sectional dimensions of said necks are of the same order of magnitude as the average phonon mean free path in said semiconductor material.

3. A thermoelectric transducer element comprising a multitude of bulk regions of semiconductor material, individually of a size in the range from 0.1 to 50 microns, bonded together by myriad interconnections consisting of semiconductor neck regions of submicroscopically small cross-sectional dimensions to constitute a continuum whose thermal and electrical properties are determined primarily by the properties of said semiconductor neck regions and enclosed in a medium having a thermal conductivity substantially less than that of the thermoelectric material.

4. A thermoelectric trandsucer element comprising a plurality of bulk regions of semiconductor material of a predetermined conductivity type interconnected with each other by myriad neck regions of semiconductor material of the same predetermined conductivity type, said neck regions having cross-sectional dimensions of the same order of magnitude as the average phonon mean free path in said semiconductor material to cause measurable phonon scattering in said neck region.

5. A thermoelectric transducer element as in claim 4 in which said neck regions are chemically different from said bulk regions.

6. An only superficially sintered thermoelectric transducer element comprising bulk regions of semiconductor material, individually of a size in the range from 0.1 to 50 microns, bonded together by constricted necks of the same semiconductor material and of such cross-sectional dimension in relation to the average phonon mean free path in said semiconductor material to provide a continuum in which bulk dislocations and imperfections in said necks result in phonon scattering and a thermoelectric figure of merit materially greater than that of said semiconductor material in bulk.

7. An only superficially sintered thermoelectric transducer element comprising a plurality of bulk regions of semiconductor material bonded together by myriad interconnecting semiconductor neck regions of cross-sectional dimensions small relative to the average phonon mean free path in said semiconductor material to provide a continuum in which the ratio of electrical conductivity to thermal conductivity is substantially greater than that of said semiconductor material in bulk.

8. A thermoelectric transducer element having an enhanced thermoelectric figure of merit comprising discrete semiconductor bulk regions, all having a majority carrier conductivity of like predetermined polarity, bonded together by semiconductor bridges having a majority carrier conductivity of said predetermined polarity, all significant cross-sectional dimensions of each of said bridges being of the same order of magnitude as the average phonon mean free path in said material.

9. A new and improved thermoelectric transducer element comprising a plurality of bulk regions of semiconductor material, individually of a size in the range from 0.1 to 50 microns, compacted into a mass having a density between 50% and 80% of the bulk density of said semiconductor material and bonded together by myriad interconnecting semiconductor neck regions of constricted cross-sections relative to those of said bulk regions to constitute a coherent mass in which the ratio of electrical to thermal conductivities is large compared with that of said semiconductor material in bulk, whereby the thermoelectric figure of merit of said mass is materially greater than that of said semiconductor material in bulk.

10. A thermoelectric transducer element formed by only superficially sintering a powdered semiconductor material, composed of particles individually of a size in the range from 0.1 to 50 microns, to increase the ratio of electrical thermal conductivities in the sintered material to a substantially greater value than the ratio of such conductivities in the bulk material.

11. A thermoelectric transducer element in accordance with claim 10 encapsulated in a medium having a thermal conductivity less than that of said sintered material.

12. A thermoelectric transducer element formed by powdering bulk semiconductor material to provide individual particles of from 0.1 to 50 microns in size, and only superficially sintering the powdered material to attain an electrical resistivity in the sintered mass within the range from 5 to 200 times the resistivity of the bulk material.

13. A thermoelectric transducer element in accordance with claim 12 in which said semiconductor material is lead telluride and is sintered at a temperature not exceeding 500° C. for approximately 3 hours.

14. A thermoelectric transducer element formed by powdering lead telluride in air to provide individual particles of from 0.1 to 50 microns in size, only superficially sintering the powdered material to increase the ratio of electrical conductivity to thermal conductivity in the sintered material to a value substantially greater than the ratio of such conductivities in said bulk material, and encapsulating said sintered material in a substantially thermally non-conductive material.

15. A thermoelectric transducer element in accordance with claim 12 in which the powdered material is superficially sintered in a non-oxidizing ambient.

16. A thermoelectric element comprising bulk particles individually of a particle size within the range from 0.1 micron to 50 microns, of semiconductor material of a predetermined conductivity type, said particles being interconnected by bridges of semiconductor material of said predetermined conductivity type, which bridges have characteristic cross-sectional dimensions of the order of 100 angstrom units to provide phonon scattering in the thermal conductivity paths between adjacent particles.

17. A thermoelectric element in accordance with claim 16, in which said semiconductor material is lead telluride.

18. A method of producing a thermoelectric semiconductor element having a thermoelectric figure of merit greater than that of the mother material in bulk, which method comprises:

providing a powdered semiconductor material composed of individual particles each of a size within the range from 0.1 micron to 50 microns;

and heating said particles in contact with each other but without the application of substantial external pressure at a temperature below the melting temperature of said semiconductor material to surface-sinter said particles into a continuum having a density within the range from 50% to 80% of that of said mother material in bulk, in which said semiconductor material is lead telluride and in which said heating of said particles is conducted at a temperature not exceeding 500° centigrade.

19. A thermoelectric transducer element comprising a continuum composed of grains of thermoelectrically responsive semiconductor material, individually of a size in the range from 100 angstrom units to 50 microns, bonded together through high-angle grain boundaries to provide a thermoelectric figure of merit substantially greater than that of said semiconductor material in bulk.

20. A thermoelectric transducer element according to claim 19, in which said grains are of a particle size in the range from 100 to 2000 angstrom units and in which said continuum is compacted to a density greater than 50% of the bulk density of said semiconductor material.

21. A thermoelectric transducer element according to claim 20, in which said material is a substantially homogeneous mixture of different semiconductor compositions.

22. A thermoelectric transducer element according to claim 19, in which said grains are of a particle size in the range from 0.1 to 50 microns and are interconnected by constricted necks with transverse dimensions of the order of 100 angstrom units with said necks containing said high-angle grain boundaries and substantially determining the theremoelectric figure of merit of said continuum.

23. A thermoelectric transducer element comprising multitudinous submicroscopically small grains of thermoelectrically responsive semiconductor material bonded together through high-angle grain boundaries of higher thermal resistance than said grains.

24. A thermoelectric transducer element comprising a multitude of grains of thermoelectrically responsive semiconductor material of a predetermined conductivity type, individually of a size in the range from 100 angstrom units to 50 microns, bonded together through high-angle grain boundaries of higher thermal resistivity than said grains to constitute a continuum whose thermal properties are determined primarily by the properties of said high-angle grain boundaries, with the electrical carrier concentration being substantially the same in said high-angle grain boundaries as in said grains.

25. A thermoelectric transducer element according to claim 24, in which said electrical carrier concentration is in the range from $10^{17}$ to $10^{19}$ carriers per cubic centimeter throughout said continuum.

26. A thermoelectric transducer element comprising grains of thermoelectrically responsive semiconductor material, individually of a particle size in the range from 100 angstrom units to 50 microns, bonded together with high-angle grain boundaries of the same semiconductor material to provide a continuum in which bulk dislocations and imperfections in said high-angle grain boundaries result in phonon scattering and a thermoelectric figure of merit materially greater than that of said semiconductor material in bulk.

27. A thermoelectric transducer element comprising a plurality of submicroscopically small grains of thermoelectrically responsive semiconductor material bonded together through high-angle grain boundaries to provide a continuum in which the ratio of electrical conductivity to thermal conductivity is substantially greater than that of said semiconductor material in bulk.

28. A new and improved thermoelectric transducer element comprising a plurality of grains of thermoelectrically responsive semiconductor material individually of a size in the range from 100 angstrom units to 50 microns, compacted into a mass having a density greater than 50% of the bulk density of said semiconductor material and bonded together through high-angle grain boundaries to constitute a coherent mass in which the ratio of electrical to thermal conductivities is large compared with that of said semiconductor material in bulk, whereby the thermoelectric figure of merit of said mass is materially greater than that of said semiconductor material in bulk.

29. A thermoelectric transducer element formed of powdered thermoelectrically responsive semiconductor material composed of particles individually of a size in the range from 100 angstrom units to 50 microns and bonded together through high-angle grain boundaries to increase the ratio of electrical to thermal conductivities in the continuum to a substantially greater value than the ratio of such conductivities in the bulk material.

30. A thermoelectric transducer element comprising grains, individually of a particle size within the range from 0.1 micron to 50 microns, of thermoelectrically responsive semiconductor material of a predetermined conductivity type, and grains being interconnected through high-angle grain boundaries of semiconductor material of said predetermined conductivity type to provide phonon scattering in the thermal conductivity paths between adjacent particles.

31. A thermoelectric transducer element comprising a continuum composed of submicroscopically small grains of thermoelectrically responsive semiconductor material of a predetermined conductivity type compacted together with high-angle grain boundaries between adjacent grains to provide a thermoelectric figure of merit substantially greater than that of said semiconductor material in bulk.

32. A thermoelectric transducer element comprising a pair of electrically conductive electrodes; a crystalline continuum of thermoelectrically responsive semiconductor material of a predetermined conductivity type interposed between said electrodes in electrical contact therewith, at least the majority of the phonon conduction paths from one of said electrodes to the other through said continuum including high angle grain boundaries at intervals less than 2000 angstrom units but greater than the electrical conduction carrier wavelength in said material.

33. A thermoelectric transducer element according to claim 32, in which said continuum has a substantially uniform electrical carrier concentration.

34. A thermoelectric transducer element according to claim 33, in which said electrical carrier concentration is in the range from $10^{17}$ to $10^{19}$ carriers per cubic centimeter.

35. A thermoelectric transducer element according to claim 32, in which said continuum is composed of grains of said material, having a mean grain size in the range from 100 to 2000 angstrom units, compacted to a density greater than 50% of the bulk density of said material.

36. A thermoelectric transducer element according to claim 32, in which said material is a substantially homogeneous mixture of different semiconductor compositions.

37. A thermoelectric transducer element comprising a continuum composed of grains of thermoelectrically responsive semiconductor material having a mean grain size L in the range from 100 to 2000 angstrom units compacted together through high-angle grain boundaries and exhibiting a substantially uniform electrical carrier concentration $n$ in the range from $10^{17}$ to $10^{19}$ carriers per cubic centimeter and exhibiting an electrical conductivity $\sigma$ to provide a thermoelectric figure of merit Z greater than the bulk thermoelectric figure of merit of said material and in accordance with the following equation $$Z=\frac{7.45\times 10^{-9}\left\{4+4.6\log_{10}\frac{n}{n_b}+\left[2.3\log_{10}\left(\frac{n}{n_b}\right)\right]^2\right\}\sigma}{\left(\frac{K_{L,B}}{1+\frac{x}{L}}\right)+4.5\times 10^{-6}\sigma}$$

in which $n_b$ is the carrier concentration in carriers per cubic centimeter corresponding to the effective density states in the conduction band (for electrons) or the valence band (for holes), $K_{L,B}$ is the lattice thermal conductivity of said material in bulk at room temperature, L is expressed in angstom units, and $\sigma$ is expressed in reciprocal ohm centimeters, and in which $x$ is an empirical constant between 1000 and 2000.

38. A thermoelectric transducer element according to claim 37, in which said material is lead telluride.

39. A thermoelectric transducer element according to claim 37, in which said material is bismuth telluride.

40. A thermoelectric transducer element according to claim 37, in which said material is lead selenide.

41. A thermoelectric transducer element according to claim 37, in which said material is a substantially homogeneous mixture of lead telluride and lead selenide.

42. A thermoelectric transducer element according to claim 37, in which said material is a substantially homogeneous mixture of lead telluride and bismuth telluride.

References Cited

UNITED STATES PATENTS

| | | | |
|---|---|---|---|
| 2,289,152 | 7/1942 | Telkes | 136—203 |
| 2,575,610 | 11/1951 | Kunzog | 75—222 |
| 2,952,980 | 9/1960 | Douglas | 62—3 |

CARL D. QUARFORTH, Primary Examiner

H. E. BEHREND, Assistant Examiner

U.S. Cl. X.R.

75—222; 136—201, 238, 239; 252—62.3